United States Patent [19]
Murakami et al.

[11] Patent Number: 5,805,559
[45] Date of Patent: Sep. 8, 1998

[54] OPTICAL RECORDING OR REPRODUCING APPARATUS

[75] Inventors: Toshiya Murakami, Kanagawa; Tsukasa Wadamori, Kagoshima, both of Japan

[73] Assignee: Sony Corporation, Japan

[21] Appl. No.: 895,897

[22] Filed: Jul. 17, 1997

[30] Foreign Application Priority Data

Aug. 22, 1996 [JP] Japan ................................. 8-221577

[51] Int. Cl.⁶ .............................. G11B 7/00; H03G 9/12
[52] U.S. Cl. .............................. 369/124; 369/116; 369/58
[58] Field of Search .............................. 369/13, 54, 116, 369/58, 124

[56] References Cited

U.S. PATENT DOCUMENTS 5,042,020  8/1991  Endo ........................................ 369/116
5,250,796  10/1993  Taguchi et al. ........................ 369/116
5,680,382  10/1997  Inoue ...................................... 369/58

*Primary Examiner*—Tod R. Swann
*Assistant Examiner*—Kim-Kwok Chu
*Attorney, Agent, or Firm*—Ronald P. Kananen

[57] ABSTRACT

A laser power control circuit for controlling the laser power is provided in an automatic power control circuit of an optical disc device, an amplitude of an RF signal is examined by the LPC circuit, a control voltage to be applied to the APC circuit is generated, and feedback is applied to control the laser power and stabilize the RF signal level. By this, the reproduction can be stably carried out by even discs having different reflection rates, an improvement of the reproduction capability can be achieved, and a lowering of the optical output of the laser diode accompanied with aging and the lowering of the reproduction capability accompanied with the lowering of the optical output due to dust adhered to the pick-up can be prevented. Further, the laser power per se is controlled, so there is no effect on the band of the RF amplifier.

15 Claims, 6 Drawing Sheets

FIG. 6

| RF SIGNAL LEVEL | RELATIONSHIP OF Vp V1 | $\Delta I_1$ | $V_L$ | $V_{LD}$ | $I_{CP}$ | $P_o$ | RF SIGNAL LEVEL |
|---|---|---|---|---|---|---|---|
| CENTER | $V_P = V_1$ | 0 | $V_L = V_2$ | CENTER | CENTER | CENTER | CENTER |
| LARGE | $V_P > V_1$ | $+\Delta I_1$ | SMALL | LARGE | SMALL | SMALL | SMALL |
| SMALL | $V_P < V_1$ | $-\Delta I_1$ | LARGE | SMALL | LARGE | LARGE | LARGE |

OPTICAL RECORDING OR REPRODUCING APPARATUS

BACKGROUND OF THE INVENTION

1. Field of the Invention

The present invention relates to an optical recording or reproducing apparatus for performing recording or reproduction of information by using a laser beam as in an optical disc device such as a CD player, more particularly relates to an improvement of circuit for controlling the laser power.

2. Description of the Related Art

In general, in an optical disc device, in order to cancel the large negative temperature characteristic possessed when driving a laser diode by a constant current and obtain a stable laser output, an automatic power control (APC) circuit is provided for controlling the laser power.

FIG. 1 is a circuit diagram, of a laser power control system of an optical disc device of a related art provided with an APC circuit.

In FIG. 1, 1 denotes an optical disc medium, 2 an optical pick-up, 3 a drive current supplying circuit, 4 a monitor use current/voltage conversion circuit, 5 an APC circuit, and 6 a current/voltage conversion circuit used as an RF signal generation circuit.

The optical pick-up 2 is provided with a laser diode 21 for emitting a laser beam LO to a recording region of the optical disc medium 1 with an intensity (power) in accordance with a value of a drive current $I_{OP}$ supplied from the drive current supplying circuit 3, a monitor use photodiode 22 which receives the laser beam LO emitted from the laser diode 21 and generates an electric signal in accordance with the level of the received light, and a photodetector 23 which receives the reflected and returned laser beam emitted to the optical disc medium 1, generates currents $I_A$, $I_B$, $I_C$, and $I_D$ of values in accordance with the level of the received light, and outputs the same to the current/voltage conversion circuit 6 as main constituent elements.

The drive current supplying circuit 3 is constituted by a pnp type transistor 31 with a base to which a drive signal $V_{LD}$ is supplied, a collector which being connected to an anode of the laser diode 21 via a coil L31, and an emitter which being connected to the supply line of the power supply voltage $V_{CC}$ via a resistance element R31 and by a capacitor C31 connected between the base of the transistor 31 and the supply line of the power supply voltage $V_{CC}$ and supplies the drive current $I_{OP}$ in accordance with an input level of the drive signal $V_{LD}$ to the laser diode 21.

The monitor use current/voltage conversion circuit 4 is constituted by a resistance element R41 connected in series between a current output end of the monitor use photodiode 22 and the reference voltage (ground) $V_{EE}$ and by a variable resistance element R42 and supplies a detection voltage $V_{PD}$ to the APC circuit 5.

The APC circuit 5 is constituted by operational amplifiers 51 and 52, a reference voltage source 53, and resistance elements R51 to R57, compares a signal obtained by amplifying the detection voltage $V_{PD}$ with the reference voltage $V_L$, and outputs the drive signal $V_{LD}$ of the level in accordance with the result of comparison to the drive current supplying circuit 3.

The current/voltage conversion circuit 6 receives current outputs $I_A$, $I_B$, $I_C$, and $I_D$ obtained at the photodetector 23 of the optical pick-up 2, performs the current-to-voltage conversion to voltages $V_A$, $V_B$, $V_C$, and $V_D$, performs so-called addition of voltages $V_A$ to $V_D$, and generates an RF signal $V_{RFO}$.

In such a configuration, the APC circuit 5 makes the laser power constant by controlling the drive current $I_{OP}$ of the laser diode 21 based on the output $V_{PD}$ of the monitor use photodiode 22 and cancels a large negative temperature characteristic possessed when driving the laser diode 21 with a constant current.

Below, a detailed explanation will be made of the input/output characteristic of the APC circuit 5. Note that, in the following explanation, for easy understanding of the explanation, the explanation will be made by using references equivalent to those used in FIG. 1 for the resistance values of the resistance elements.

First, outputs $V_{PD}$ of the monitor use photodiode 22 and the conversion circuit 4 are input to a non-inverted input terminal (+) of the operational amplifier 51 of the APC circuit 5 via a terminal $T_{PD}$. The following relationships stand between the voltage Va on the inverted input terminal (−) side and the voltage Vb on the output side:

$$Va = V_{PD} \tag{1}$$

$$Vb = \{(R_{51} + R_{52})/R_{51}\} Va = \{(R_{51} + R_{52})/R_{51}\} V_{PD} \tag{2}$$

The voltage Vc of the non-inverted input terminal (+) side of the operational amplifier 52 can be represented by the following equation since the non-inverted input terminal (+) is connected to the output of the operational amplifier 51 via the resistance element $R_{53}$ and connected to the supply line of the power supply voltage $V_{CC}$ via the resistance element $R_{54}$:

$$\begin{aligned} Vc &= \{R_{53}/(R_{53}+R_{54})\}(V_{CC}-Vb)+Vb \\ &= \{R_{53}/(R_{53}+R_{54})\}V_{CC}+\{R_{54}/(R_{53}+R_{54})\}Vb \end{aligned} \tag{3}$$

The output side voltage $V_{LD}'$ of the operational amplifier 52 is given by the following equation:

$$V_{LD}' = \{(R_{55}+R_{56})/R_{55}\}(Vc-V_L)+V_L \tag{4}$$

The following equation is obtained from above equations (2) to (4):

$$\begin{aligned} V_{LD}' &= \{(R_{55}+R_{56})/R_{55}\} \times [\{R_{53}/(R_{53}+R_{54})\}V_{CC} + \\ & \{R_{54}/(R_{53}+R_{54})\} \times \{(R_{51}+R_{52})/R_{51}\}V_{PD}-V_L]+V_L = \\ & \{R_{53}/(R_{53}+R_{54})\} \times \{(R_{55}+R_{56})/R_{55}\}V_{CC} + \\ & \{(R_{51}+R_{52})/R_{51}\} \times \{R_{54}/(R_{53}+R_{54})\} \times \\ & \{(R_{55}+R_{56})/R_{55}\}V_{PD}-(R_{56}/R_{55})V_L \end{aligned} \tag{5}$$

Here, when defining $R_{53}=R_{55}$ and $R_{54}=R_{56}$ so as to make the coefficient of $V_{CC}$ 1, the above equation (5) is modified as follows:

$$V_{LD}' = \{(R_{51}+R_{52})/R_{51}\} \times (R_{54}/R_{53})V_{PD} + V_{CC}-(R_{54}/R_{53})V_L = \alpha V_{PD}+V_{CC}-KV_L \tag{6}$$

Here, $$\alpha = \{R_{54} \times (R_{51}+R_{52})\}/(R_{51} \times R_{53})$$

and $$K = R_{54}/R_{53}.$$

Accordingly, the drive signal $V_{LD}$ is given by the following equation:

$$V_{LD} = \alpha V_{PD}+V_{CC}-KV_L+(R_{57}/h_{fe(31)}) \times I_{OP} \tag{7}$$

Note, $h_{fe(31)}$ indicates a current amplification rate of the pnp type transistor 31.

Here, if the temperature rises and the detection voltage $V_{PD}$ falls, it is seen from Equation (7) that the level of the drive signal $V_{LD}$ falls.

Further, $V_{LD}$ can be represented by the following equation:

$$V_{LD} = V_{CC} - R_{31} \cdot I_{OP} - V_{BE(31)} \quad (8)$$

The following equation is found from Equation (8):

$$I_{OP} = \{(V_{CC} - V_{BE(31)} - V_{LD})/R_{31}\} \quad (9)$$

It is seen from Equation (9) that when the level of the drive signal $V_{LD}$ becomes small, the drive current $I_{OP}$ is increased.

Further, the laser power $P_0$ is represented by the following equation:

$$P_0 = \eta_D \times I_{OP} - \beta \quad (10)$$

Note, $\eta_D$ indicates a differentiation efficiency of the laser diode, and $\beta$ indicates a current amplification rate.

It is seen from Equation (9) that if the drive current $I_{OP}$ is increased, the laser power $P_0$ is increased.

The APC circuit 5 therefore, as described above, cancels the large negative temperature characteristic possessed when driving the laser diode 21 with the constant current.

The current outputs $I_A$ to $I_D$ are obtained from the reflected and returned light RLO of the optical disc medium 1 of the emitted light LO of the laser diode 21 feedback-controlled as described above by the photodetector 23 of the optical pick-up 2. These are subjected to current-to-voltage conversion to voltages $V_A$, $V_B$, $V_C$, and $V_D$ at the current/voltage conversion circuit 6, the voltages $V_A$ to $V_D$ are added to each other, and an RF signal $V_{RFO}$ is generated.

Further, in the optical disc device of the related art, a circuit for stabilizing the level of for example the generated RF signal $V_{RFO}$ is provided.

An example of configuration of the RF signal level stabilizing circuit is shown in FIG. 2.

As shown in FIG. 2, the RF signal $V_{RFO}$ serving as the recording signal read from the optical disc medium 1 is input to the RF amplifier 7 provided with the voltage control amplifier (VCA).

The output of the VCA-equipped RF amplifier 7 is input to the RF detection circuit 8.

A control voltage to be applied to the VCA is generated by examining the amplitude of the RF signal at this RF detection circuit 8, and the RF signal level is stabilized by applying the feedback.

However, in the circuit of FIG. 1 mentioned above, even if the temperature characteristic is cancelled by the APC circuit 5 and the laser power is made constant, if the data is reproduced from optical disc media having different reflection rates, there is a problem that the RF signal level will vary according to the optical disc medium.

A variation of the RF signal level exerts an influence upon not only the focus error signal level, but also scratch detection, mirror detection, etc. and is a factor reducing the reproduction capability of the apparatus.

Further, where the laser power is reduced due to aging, the RF signal level is lowered at the same time.

Further, in the RF signal stabilization circuit shown in FIG. 2, a broad band VCA which does not exert an influence upon the RF signal becomes necessary, but it is technically difficult to realize such a VCA.

SUMMARY OF THE INVENTION

An object of the present invention is to provide an optical disc device with which the RF signal level can be stabilized, reproduction can be stably carried out even in discs having different reflection rates, and consequently the reproduction capability can be improved.

To attain the above object, the present invention provides an optical recording or reproducing apparatus for performing recording and reproduction of information by emitting a laser beam to an optical recording medium, having a laser beam source for emitting a laser beam of an intensity in response to the amount of the supplied current; a current supplying means for supplying a current of an amount in response to the drive signal to the laser beam source; a light intensity detecting means for detecting the intensity of the laser beam emitted from the laser beam source; an RF signal generating means for generating an RF signal of a level in response to the returned light intensity from a reflected and returned light of the optical recording medium; a control signal generating means for detecting the RF signal level generated by the signal generating means and generating a control signal of a level in response to the result of comparison of the detection level and the reference level; and a current control means for receiving the result of detection of the laser beam intensity of the light intensity detecting means, generating the drive signal so that the current supply amount is reduced where the control signal generated by the control signal generating means indicates that the detection level is larger than the reference level and so that the current supply amount is increased where it indicates that the detection level is smaller than the reference level, and outputting the same to the current supplying means.

Further, the control signal generating means has a first circuit for detecting the level of the RF signal generated by the RF signal generating means and a second circuit which compares the detection level of the first circuit and the reference level, generates the control signal of the level in response to the difference, and outputs the same to the current control means.

According to the optical recording or reproducing apparatus of the present invention, in the control signal generating means, the control signal to be applied to the current control means is generated by examining the amplitude of the RF signal, the drive signal based on this control signal is generated by the current control means, feedback is applied to the current supplying means, the laser power is controlled, and stabilization of the RF signal level is achieved.

By this, even with discs having different reflection rates, reproduction can be stably carried out and consequently the reproduction capability is improved.

Further, the control signal generating means is optionally held in an OFF state by for example an external signal. When the detection level and the reference level are substantially equal in the second circuit in for example the control signal generating means, the output of the control signal is stopped. By this, the above feedback control is stopped, and a reduction of the service life due to the stopping of the feedback control and the passage of a large current through the laser diode at the focus search or focus bias adjustment is prevented.

BRIEF DESCRIPTION OF THE DRAWINGS

These and other objects and features of the present invention will become clearer from the following description of the preferred embodiments given with reference to the attached drawings, in which:

FIG. 6 is a view of the state of operation of the circuit of FIG. 3 and FIG. 4.

DESCRIPTION OF THE PREFERRED EMBODIMENTS

Below, a detailed explanation will be made of the embodiments of the present invention by using the attached drawings.

Figure 3:
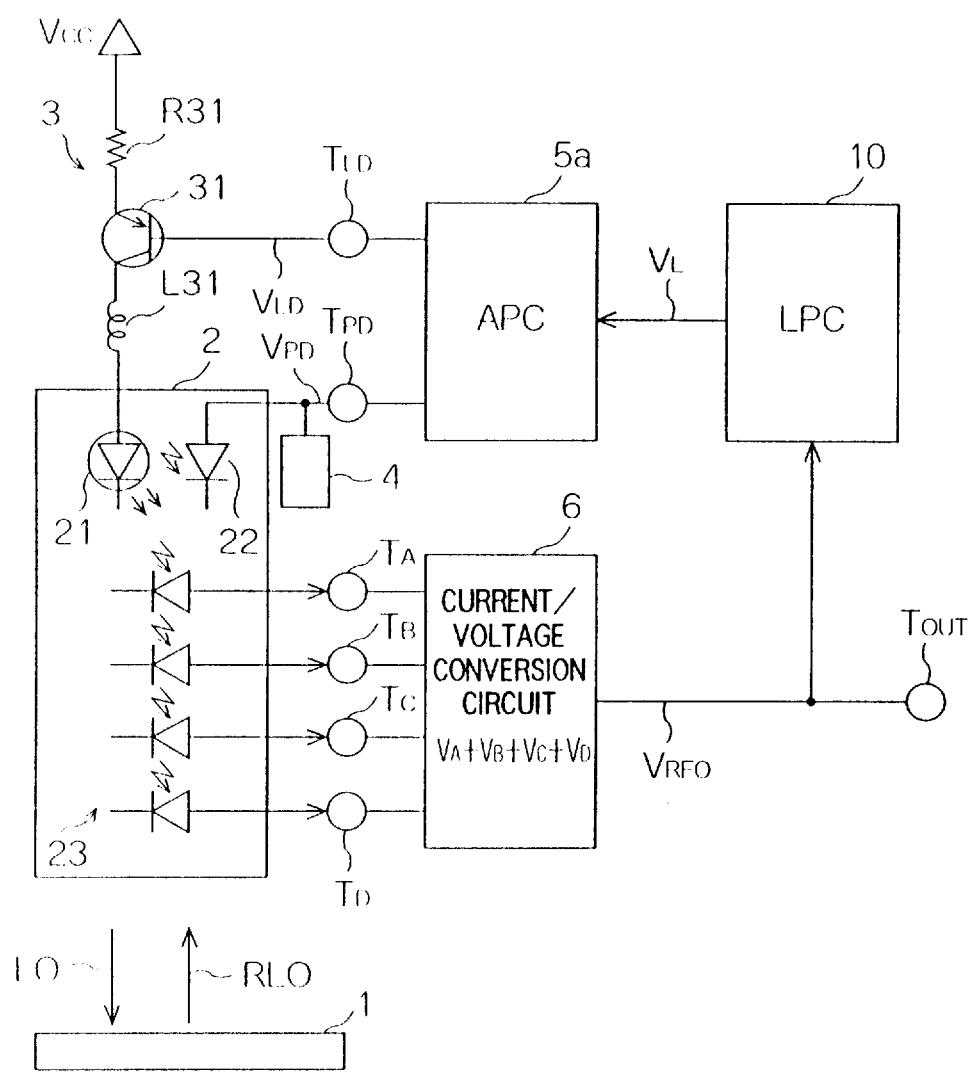
FIG. 3 is a block diagram of a first embodiment of the optical disc device according to the present invention.
Figure 4:
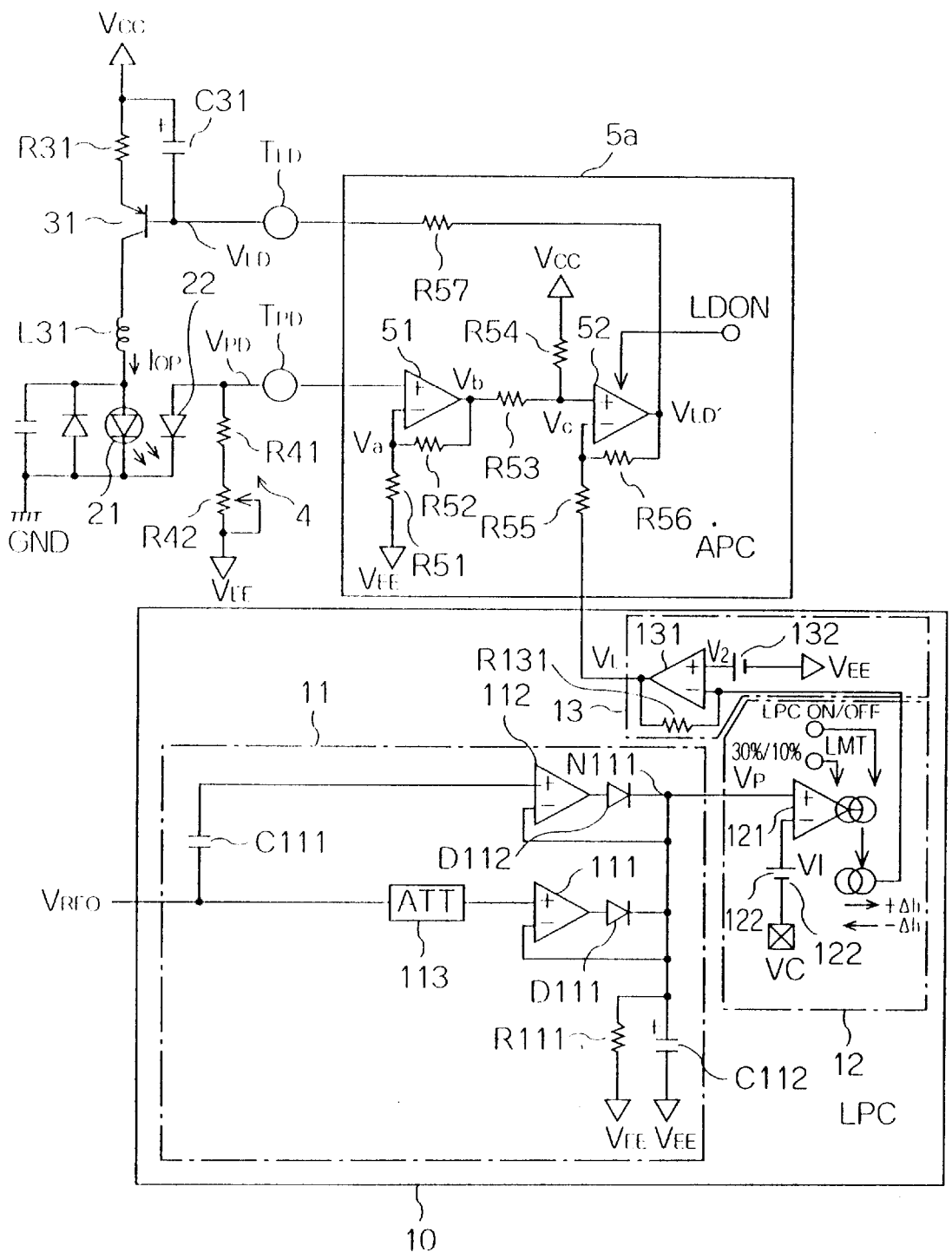
FIG. 4 is a circuit diagram of a concrete example of the configuration of a principal part of FIG. 3 as a second embodiment of the present invention.

FIG. 3 is a block diagram of an embodiment of the optical disc device according to the present invention; and FIG. 4 is a circuit diagram of a concrete example of the configuration of the principal part of FIG. 3. Further, FIG. 3 shows the RF signal waveform.

Figure 1:
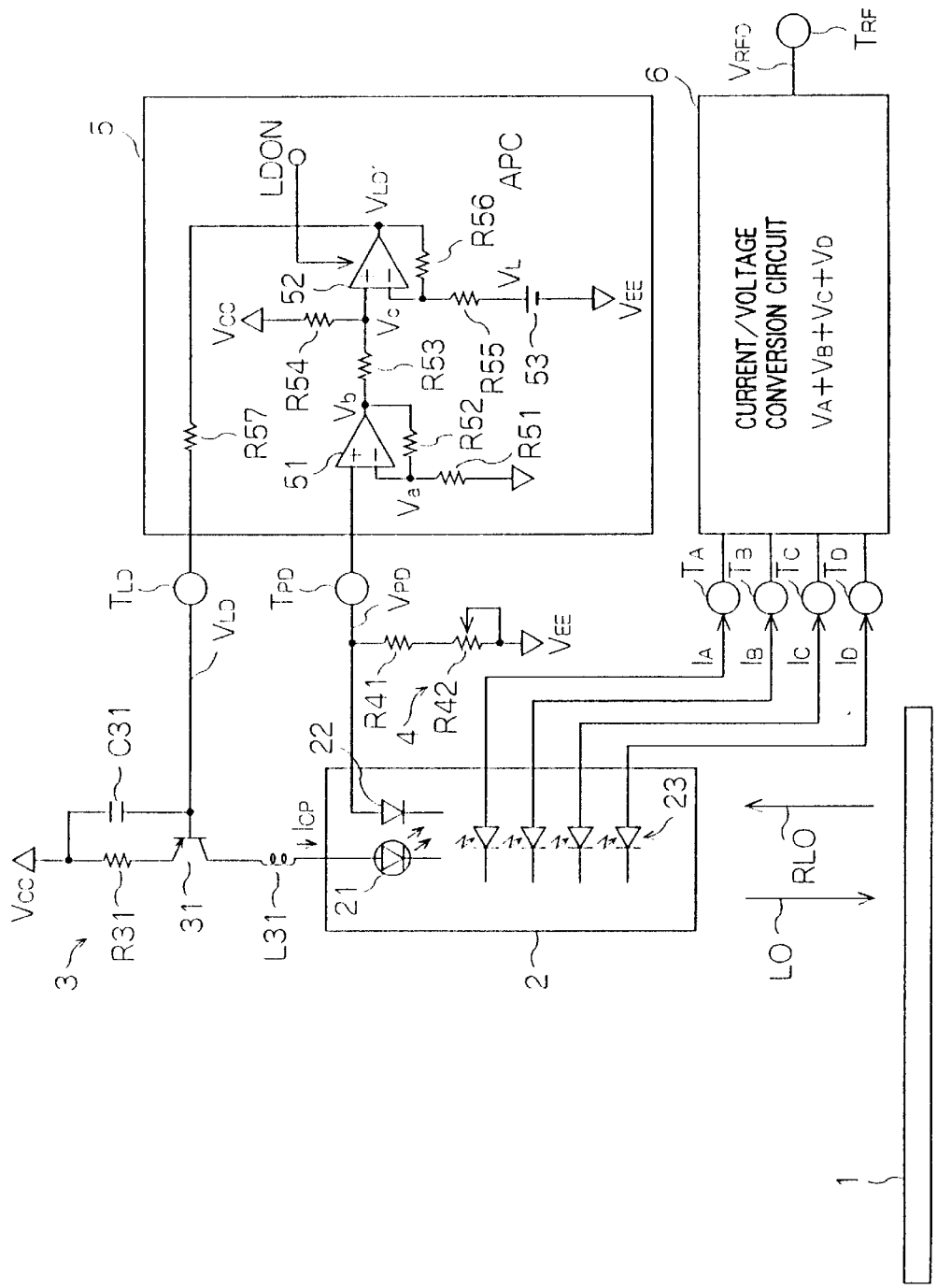
FIG. 1 is a circuit diagram of an example of the configuration of an optical disc device of the related art.
Figure 2:
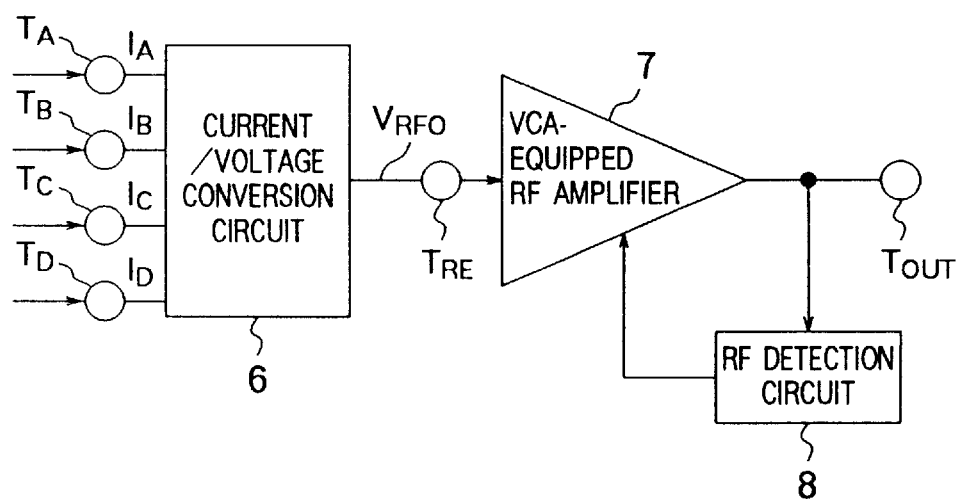
FIG. 2 is a block diagram of an example of the configuration of an RF signal stabilization circuit of the related art.

In FIG. 3 and FIG. 4, the same constituent parts as those of FIG. 1 are represented by same reference numerals.

Namely, 1 denotes an optical disc medium, 2 an optical pick-up, 3 a drive current supplying circuit, 4 a monitor use current/voltage conversion circuit, 5a an APC circuit used as the current control means, 6 a current/voltage conversion circuit used as the RF signal generating means, and 10 denotes a laser power control (LPC) circuit as the control signal generating means.

The APC circuit 5a receives the output $V_{PD}$ of the monitor use photodiode 22 and the conversion circuit 4, generates a drive signal $V_{LD}$ of a level which is raised so as to reduce the amount of the current supply where the control signal $V_L$ generated at the LPC circuit 10 indicates that the detection level is larger than the reference level as the result of detection of the RF signal level and of a level which is lowered so as to increase the amount of the current supply where the control signal $V_L$ indicates that the detection level is smaller than the reference level and outputs the same to the drive current supplying circuit 3.

The APC circuit 5a of the second embodiment of the present invention is constituted by operational amplifiers 51 and 52 and resistance elements R51 to R57 as shown in FIG. 4.

A non-inverted input terminal (+) of the operational amplifier 51 is connected to the input terminal $T_{PD}$ of the detection voltage $V_{PD}$, while the inverted input terminal (−) is connected to the reference voltage $V_{EE}$ via the resistance element R51 and connected to the output terminal via the resistance element R52. The output terminal of the operational amplifier 51 is connected to the non-inverted input terminal (+) of the operational amplifier 52 via the resistance element R53. Further, the non-inverted input terminal (+) of the operational amplifier 52 is connected to the supply line of the power supply voltage $V_{CC}$ via the resistance element R54.

The inverted input terminal (−) of the operational amplifier 52 is connected to the control signal output line of the LPC circuit 10 via the resistance element R55 and connected to the output terminal via the resistance element R56. The output terminal of the operational amplifier 52 is connected to the drive signal output terminal $T_{LD}$ via the resistance element R57.

The APC circuit 5a of FIG. 4 generates the drive signal $V_{LD}$ of a level which is raised in accordance with the lowering of the level of the control signal $V_L$ when the level of the control signal $V_L$ output from the LPC circuit 10 becomes low (when the RF signal level is high). In this case, control is performed so that the drive current $I_{OP}$ from the drive current supplying circuit 3 becomes small.

On the other hand, when the control signal $V_L$ becomes high (when the RF signal level is low), a drive signal $V_{LD}$ of a level which is lowered in accordance with the rise of the level thereof is generated. In this case, control is performed so that the drive current $I_{OP}$ of the drive current supplying circuit 3 becomes large.

The LPC circuit 10 detects the RF signal level generated at the current/voltage conversion circuit 6, generates the control signal $V_L$ of a level in accordance with the result of comparison of the detection level and the reference level, and outputs the same to the APC circuit 5a.

The LPC circuit 10 is concretely constituted by, as shown in FIG. 4, a peak hold circuit 11 for holding a peak value of the RF signal $V_{RFO}$, a voltage/current conversion circuit 12 for comparing the output $V_P$ of the peak hold circuit 11 and the reference level $V_1$ and converting the difference thereof to the current, and a current/voltage conversion circuit 13 for converting the output current $I_1$ of the voltage/current conversion circuit 12 to a voltage by a relationship with the reference level $V_2$ and outputting the same as the control signal $V_{LD}$ to the APC circuit 5a.

The peak hold circuit 11 is constituted by operational amplifiers 111 and 112, diodes D111 and D112, an attenuator (ATT) 113, a capacitor C111 for cutting a direct current (DC) component from the RF signal, a peak hold use capacitor C112, and a resistance element R111.

The input line of the RF signal $V_{RFO}$ is connected to the input terminal of the attenuator 113 and one electrode of the DC cut capacitor C111. The output terminal of the attenuator 113 is connected to the non-inverted input terminal (+) of the operational amplifier 111, and the other electrode of the capacitor C111 is connected to the non-inverted input terminal (+) of the operational amplifier 112.

The output terminal of the operational amplifier 111 is connected to the anode of the diode D111, while the cathode of the diode D111 is connected to the output node N111 of the peak hold value $V_P$, the inverted input terminal (−) of the operational amplifier 111, one electrode of the capacitor C112, and one end of the resistance element R111.

Similarly, the output terminal of the operational amplifier 112 is connected to the anode of the diode D112, while the cathode of the diode D112 is connected to the output node N111 of the peak hold value $V_P$ and the inverted input terminal (−) of the operational amplifier 112, one electrode of the capacitor C112, and one end of the resistance element R111.

The other electrode of the capacitor C112 and the other end of the resistance element R111 are connected to the reference voltage $V_{EE}$.

The attenuator 113 performs the adjustment of the level of the input RF signal $V_{RFO}$ and the reference level $V_1$ in the voltage/current conversion circuit 12 of the next stage.

Further, the capacitor C111 cuts the DC component from the RF signal $V_{RFO}$ containing an alternating current (AC) component and inputs the same to the operational amplifier 112 constituting the peak detection system.

Namely, the peak hold circuit 11 in the present embodiment is constituted so as to perform the RF signal level detection for stabilizing the RF signal level by holding both of the peak values containing the AC component and the DC component of the RF signal.

Figure 5:
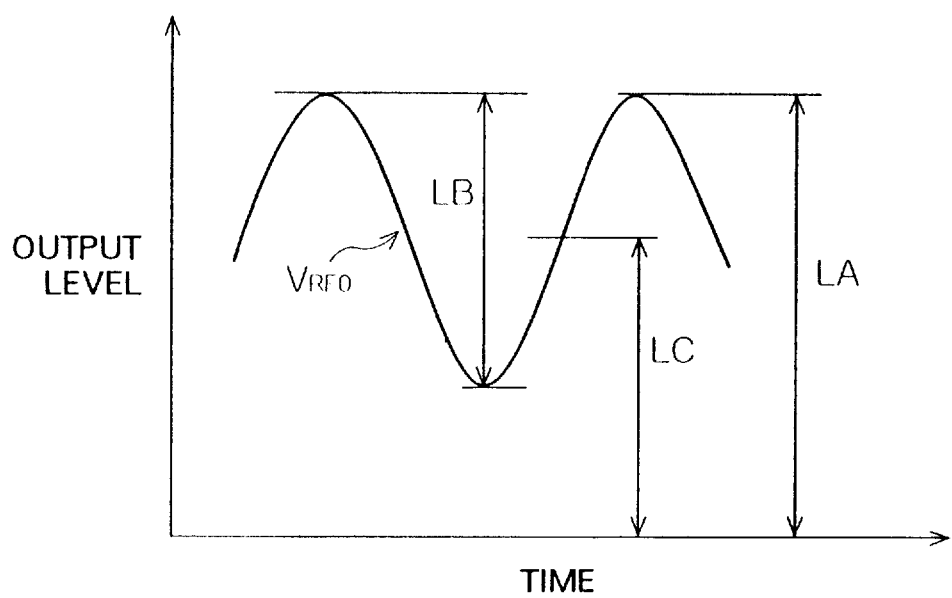
FIG. 5 is a view of an RF signal waveform.

In the holding operation of the peak value containing these AC component and DC component, a level indicated by LA is held on the side containing the DC component as shown in FIG. 5, and a level indicated by LB is held on the side containing only the AC component obtained by cutting the DC component. Note that, in actuality, the level adjustment is carried out by the attenuator 113 so that the level LA becomes substantially equivalent to the level LB.

The present embodiment is configured so that the larger level between LA and LB of FIG. 5 is held.

In this way, by detecting both of the level LA and the level LB shown in FIG. 5, a level difference of LA and LB due to a difference of the optical disc media can be dealt with and the laser power can be reduced by the larger level between LA and LB when the RF signal becomes large, therefore the load with respect to the laser diode can be reduced.

Note that, if not essential, it is also possible to configure the apparatus so as to detect the level by either one of LA or LB.

Further, it is also possible to configure the apparatus so that the level detection indicated by LC in FIG. 5 finding the level difference between LA and LB is carried out, although there would then be an effect from the degree of modulation of the optical disc medium.

Further, in the peak hold circuit 11, the recovery time of the peak hold is set by the resistance element R111 and the capacitor C112.

If there is for example a fingermark, scratch, or the like on the optical disc medium 1, the RF signal level is lowered, but desirably a long recovery time of 500 ms or more is set so as not to track such an outer disturbance.

The voltage/current (V/I) conversion circuit 12 is constituted by a V/I converter 121 and a reference voltage source 122.

The non-inverted input terminal (+) of the V/I converter 121 is connected to the output node N111 of the peak hold circuit 11, the inverted input terminal (−) is connected to the reference voltage source 122, and the output terminal is connected to the input terminal of the current/voltage (I/V) conversion circuit 13.

Further, the V/I converter 121 in the present embodiment applies a limit to the output current $\Delta I_1$ for the following reason:

That is, if, when the RF signal level becomes small, the operation is carried out so as to raise the laser power $P_0$ by passing an increased drive current $I_{OP}$, the load of the laser diode 21 becomes heavy if the laser power $P_0$ is raised too high and the service life becomes short.

Therefore, in the present embodiment, in order to apply a limit to the laser power $P_0$, the apparatus is configured so that a limit is applied to the output current $\Delta I_1$ of the V/I converter 121.

Further, the laser power $P_0$ is different according to the optical pick-up, so it is possible to change the limit value of ±30% and ±10% according to need.

This limit control is carried out by a signal LMT.

Note that, the method of limiting the laser power $P_0$ is not restricted to only the method of limiting the output current $\Delta I_1$ of the V/I converter 121. Any method can be adopted so far as the range of change of $V_L$ can be restricted.

Further, the LPC circuit 10 is constituted so that it can be held in the OFF state by making $V_L$ equal to $V_2$.

In this way, by making it possible to bring the LPC circuit 10 into the OFF state, an excess current flowing through the laser diode at the focus search or focus bias adjustment operation can be prevented.

The present embodiment is configured so that the LPC circuit 10 is held in the OFF state by not passing the output current $\Delta I_1$ of the V/I converter 121.

Note that, a similar effect is obtained even if the voltage is switched by for example an operation switch.

The current/voltage conversion circuit 13 is constituted by an operational amplifier 131 and a reference voltage source 132.

The non-inverted input terminal (+) of the operational amplifier 131 is connected to the reference voltage source, and the inverted input terminal (−) is connected to the output terminal of itself via the output terminal of the voltage/current conversion circuit 12 and the resistance element R131. The output terminal of the operational amplifier 131 is connected to the inverted input terminal (−) of the operational amplifier 52 of the LPC circuit 5a via the resistance element R55.

In this current/voltage conversion circuit 13, a control signal $V_L$ of a level which is lowered according to an amount of increase when the detection level of the RF signal is high and the output current $I_1$ of the voltage/current conversion circuit 12 is increased and of level which is raised according to the amount of reduction when the output current $I_1$ is reduced is generated.

Next, an explanation will be made of the operation by the above configuration.

First, the drive current $I_{OP}$ is supplied from the drive current supplying circuit 3 to the laser diode 21 of the optical pick-up 2. By this, the laser beam LO of a power in accordance with the value of the drive current $I_{OP}$ is emitted from the laser diode 21 to the optical disc medium 1.

Then, the light reflected and returned from the optical disc medium 1 is received at the photodetector 23 of the optical pick-up 2 and converted to the current I ($I_A$ to $I_D$).

The output current I of this photodetector 23 can be represented as in the following equation:

$$I = P_0 \times C \times D \qquad (11)$$

Here, C represents a reflection efficiency, and D represents a light-to-current conversion efficiency of the photodetector 23.

The output currents $I_A$ to $I_D$ of the photodetector 23 are input to the current/voltage conversion circuit 6 and converted to voltages $V_A$ to $V_D$ as shown in the following equation. Then, the converted voltages $V_A$ to $V_D$ are added to each other, and the RF signal $V_{RFO}$ is generated and output to the LPC circuit 10.

$$\begin{aligned} V_{RFO} &= (I_A + I_B + I_C + I_D) \times R \\ &= V_A + V_B + V_C + V_D \end{aligned} \qquad (12)$$

Note that, R here indicates the current-to-voltage conversion coefficient.

$V_{RFO}$ of FIG. 4 indicates the output signal of the current/voltage conversion circuit shown in FIG. 3.

The RF signal input to the LPC circuit 10 is first input to the peak hold circuit 11. In the peak hold circuit 11, both of the peak values containing the AC component and the DC component of the RF signal $V_{RFO}$ are detected, and the larger level is held and output as $V_P$ to the voltage/current conversion circuit 12.

In the voltage/current conversion circuit 12, the output $V_P$ of the peak hold circuit 11 and the reference level $V_1$ are compared, and a difference thereof is converted to the current $I_1$ and output to the current/voltage conversion circuit 13.

The converted current $\Delta I_1$ is given by the following equation.

$$\Delta I_1 = (V_P - V_1) \times gm \tag{13}$$

Note, gm represents the change of output current with respect to the input voltage change.

Then, in the current/voltage conversion circuit 13, the output current $I_1$ of the current/voltage conversion circuit 12 is converted to a voltage by the relationship with the reference level $V_2$ and output as the control signal $V_l$ to the APC circuit 5a.

The control signal $V_L$ is given by the following equation:

$$V_L = (-\Delta I_1 \times R_{131}) + V_2 \tag{14}$$

When the output $V_P$ of the peak hold circuit 11 and the reference level $V_1$ are equal, the output current $\Delta I_1$ of the voltage/current conversion circuit 12 does not flow, therefore $V_L$ becomes equal to $V_2$. In the present example, this state is defined as the center. Namely, the laser power/RF signal is in the center state.

The relationship of the control signal voltage $V_L$ to be applied to the APC circuit 10 and the laser power $P_0$ can be represented as in the following Equation (17):

Since the above mentioned Equation (7) is equal to Equation (8), the following equations are obtained:

$$\alpha V_{PD} + V_{CC} - KV_L + (R_{57} \cdot I_{OP})/h_{fe(31)} = V_{CC} = R_{31} \cdot I_{OP} - V_{BE(31)} \tag{15}$$

$$I_{OP} = 1/(R_{57}/h_{fe(131)} + R_{31}) \times (KV_L - \alpha V_{PD} - V_{BE(131)}) \tag{16}$$

Equation (17) showing the relationship of the voltage (control signal) $V_L$ and the laser power $P_0$ is obtained by assigning the above Equation (16) into Equation (10).

$$P_0 = \eta_D/(R_{57}/h_{fe(131)} + R_{31}) \times (KV_L - \alpha V_{PD} - V_{BE(131)}) - \beta \tag{17}$$

In the APC circuit 5a, a drive signal $V_{LD}$ of a level which is increased in accordance with the lowering of the level of the control signal $V_L$ when the level of the control signal $V_L$ output from the LPC circuit 10 becomes low is generated and a drive signal $V_{LD}$ of a level which is lowered in accordance with the rise of the level of the control signal $V_L$ when the control signal $V_L$ becomes high is generated. They are supplied to the base of the pnp type transistor 31 of the drive current supplying circuit 3.

The RF signal level is stabilized by controlling the laser power by generating the control signal $V_L$ to be applied to the APC circuit 5a by examining the amplitude of the RF signal $V_{RFO}$ by the LPC circuit 10 and applying the feedback as described above.

Note that, FIG. 6 shows the operation state of the circuits of FIG. 3 and FIG. 4 mentioned above.

As explained above, the present embodiment does not stabilize the RF signal level by adding the VCA to the RF amplifier. Instead, the LPC circuit 10 which controls the laser power is provided in the APC circuit 5a of the optical disc device, the amplitude of the RF signal $V_{RFO}$ is examined by the LPC circuit 10, the control signal $V_L$ to be applied to the APC circuit 5a is generated, and feedback is applied to control the laser power and stabilize the RF signal level, therefore there is the advantage that the reproduction can be stably carried out even in discs having different reflection rates and the improvement of the reproduction capability can be achieved.

Further, the lowering of the optical output of the laser diode and the lowering of the reproduction capability accompanying the lowering of the optical output due to dust adhered to the pick-up can be prevented.

Further, since the laser power per se is controlled, there is no effect upon the band of the RF amplifier.

Note that, in the present embodiment, the current-to-voltage conversion is carried out outside the optical pick-up, but a configuration in which the current-to-voltage conversion is carried out inside the optical pick-up can be adopted as well. In this case, an effect similar to that by the present embodiment can be obtained.

What is claimed is:

1. An optical recording or reproducing apparatus for performing recording or reproduction of information by emitting a laser beam to an optical recording medium, comprising:

a laser beam source for emitting said laser beam of an intensity in response to a signal to be supplied;

a signal supplying means for supplying the signal in response to a drive signal to said laser beam source;

an optical detecting means for detecting the laser beam emitted from said laser beam source;

an RF signal generating means for generating an RF signal of a level in response to the reflected light from said optical recording medium;

a reference signal generating means for detecting the light from said laser beam source and generating a reference level;

a control signal generating means for detecting the RF signal level generated by said signal generating means and generating a control signal of a level in response to the result of comparison of the detection level and said reference level; and a current control means for generating a signal for controlling the current of said laser beam source in response to the output signal from the control signal generating means.

2. An optical recording or reproducing apparatus according to claim 1, wherein said RF signal generating means is constituted by a peak hold circuit for holding the peak value of the RF signal generated by said RF signal generating means.

3. An optical recording or reproducing apparatus according to claim 2, wherein said peak hold circuit detects and holds at least a peak value between a peak value containing only an AC component of the RF signal and a peak value containing the AC component and a DC component.

4. An optical recording or reproducing apparatus according to claim 2, wherein said peak hold circuit detects a peak value containing only an AC component of the RF signal and a peak value containing the AC component and an DC component and holds the larger peak value.

5. An optical recording or reproducing apparatus according to claim 1, wherein said RF signal generating means has a means for limiting a range of change of the laser power.

6. An optical recording or reproducing apparatus according to claim 1, further comprising a means capable of optionally holding said control signal generating means in an OFF state.

7. An optical recording or reproducing apparatus according to claim 1, wherein said RF signal generating means controls the output of the control signal in response to the detection level and the reference level.

8. An optical recording or reproducing apparatus for performing recording and reproduction of information by emitting a laser beam to an optical recording medium, comprising:

a laser beam source for emitting said laser beam of an intensity in response to the amount of a supplied current;

a current supplying means for supplying a current to said laser beam source in response to a drive signal;

a light intensity detecting means for detecting the intensity of the laser beam emitted from said laser beam source;

an RF signal generating means for generating an RF signal of a level in response to the returned light intensity from the reflected and returned light of said optical recording medium;

a control signal generating means for detecting the RF signal level generated by said signal generating means and generating a control signal of a level in response to the result of comparison of the detection level and the reference level; and a current control means for receiving the result of detection of the laser beam intensity of said light intensity detecting means, generating said drive signal so that the current supply amount is reduced where the control signal generated by said control signal generating means indicates that the detection level is larger than the reference level and so that the current supply amount is increased where it indicates that the detection level is smaller than the reference level and outputting the same to said current supplying means.

9. An optical recording or reproducing apparatus according to claim 8, wherein said control signal generating means has:

a first circuit for detecting the level of the RF signal generated by said RF signal generating means and a second circuit which compares the detection level of said first circuit and the reference level, generates a control signal of a level in response to the difference, and outputs the same to said current control means.

10. An optical recording or reproducing apparatus according to claim 9, wherein said first circuit is constituted by a peak hold circuit for holding the peak value of the RF signal generated by said RF signal generating means.

11. An optical recording or reproducing apparatus according to claim 10, wherein said peak hold circuit detects and holds at least either peak value between a peak value containing only an AC component of the RF signal and a peak value containing an AC component and a DC component.

12. An optical recording or reproducing apparatus according to claim 10, wherein said peak hold circuit detects a peak value containing only an AC component of the RF signal and a peak value containing the AC component and a DC component and holds the larger peak value.

13. An optical recording or reproducing apparatus according to claim 9, wherein said second circuit has a means for controlling the range of change of the laser power.

14. An optical recording or reproducing apparatus according to claim 9, further comprising a means capable of optionally holding said control signal generating means in an OFF state.

15. An optical recording or reproducing apparatus according to claim 9, wherein said RF signal generating means controls the output of the control signal in response to the detection level and the reference level.

* * * * *